(12) United States Patent
Kaida et al.

(10) Patent No.: US 9,899,623 B2
(45) Date of Patent: Feb. 20, 2018

(54) DISPLAY DEVICE AND METHOD OF MANUFACTURING THE SAME

(71) Applicant: Japan Display Inc., Tokyo (JP)

(72) Inventors: Masakazu Kaida, Tokyo (JP); Noriyoshi Kanda, Tokyo (JP); Hirohisa Tanaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/245,734

(22) Filed: Aug. 24, 2016

(65) Prior Publication Data

US 2017/0077437 A1   Mar. 16, 2017

(30) Foreign Application Priority Data

Sep. 10, 2015   (JP) .................................. 2015-178480

(51) Int. Cl.

| | | |
|---|---|---|
| H01L 29/18 | (2006.01) | |
| H01L 51/52 | (2006.01) | |
| H01L 27/32 | (2006.01) | |
| H01L 51/56 | (2006.01) | |
| H01L 51/00 | (2006.01) | |

(52) U.S. Cl.
CPC ...... *H01L 51/5206* (2013.01); *H01L 27/3244* (2013.01); *H01L 51/0023* (2013.01); *H01L 51/56* (2013.01); *H01L 2227/323* (2013.01); *H01L 2251/301* (2013.01); *H01L 2251/308* (2013.01)

(58) Field of Classification Search
CPC .................................................. H01L 27/3244
USPC .......................................................... 257/88
See application file for complete search history.

(56) References Cited

U.S. PATENT DOCUMENTS

| | | | |
|---|---|---|---|
| 2006/0092351 A1 | 5/2006 | Kim et al. | |
| 2011/0241000 A1 | 10/2011 | Choi et al. | |
| 2011/0278615 A1* | 11/2011 | No ....................... | H01L 27/3248 257/98 |
| 2013/0056785 A1* | 3/2013 | Hwang ................... | H01L 27/15 257/99 |

(Continued)

FOREIGN PATENT DOCUMENTS

| | | |
|---|---|---|
| JP | 2015-69861 A | 4/2015 |
| KR | 2006-0038069 A | 5/2006 |
| KR | 2011-0109048 A | 10/2011 |

OTHER PUBLICATIONS

Korean Office Action dated Dec. 21, 2016 for corresponding Korean Application No. 10-2016-0102419.

*Primary Examiner* — Jami M Valentine
(74) *Attorney, Agent, or Firm* — Typha IP LLC (57) ABSTRACT

A display device a display region arranged with a plurality of pixels in a matrix shape, wherein each of the plurality of pixels includes a first electrode including a first conducting layer on the first conducting layer and comprised from Mo or a Mo alloy, a second conducting layer comprised from Ag or an Ag alloy, and a third conducting layer on the second conducting layer and comprised from a metal oxide having conducting properties, the first electrode being arranged corresponding to each of the pixels respectively, a light emitting layer above the third conducting layer and emitting light according to a current supply, and a second electrode above the light emitting layer and allowing at least a part of the light from the light emitting layer to pass through.

7 Claims, 12 Drawing Sheets

(56) References Cited

U.S. PATENT DOCUMENTS

2014/0097411 A1* 4/2014 Choi .................. H01L 27/1225
                                                        257/40
2015/0090991 A1    4/2015 Ishii et al.

* cited by examiner

FIG. 10D ial Patent Application No. 2015-178480 filed on Sep. 10 2015, the entire contents of which are incorporated herein by reference.

DISPLAY DEVICE AND METHOD OF MANUFACTURING THE SAME

CROSS-REFERENCE TO RELATED APPLICATIONS

This application is based upon and claims the benefit of priority from the prior Japanese Patent Application No. 2015-178480 filed on Sep. 10 2015, the entire contents of which are incorporated herein by reference.

FIELD

The present invention is related to a display device and a method of manufacturing the display device. In particular, the present invention is related to a structure of a pixel electrode in a display device and a method of manufacturing the same.

BACKGROUND

A display device such as a thin type display is arranged with an electrode (pixel electrode) in each pixel. For example, in a display device which uses a current drive type element such as an OLED (Organic Light Emitting Diode), an OLED current is supplied to each pixel electrode. A light emitting state of an OLED is controlled by a pixel circuit including a drive element such as a thin film transistor (TFT). Light of an OLED is emitted from a substrate side on the opposite side to the side where the thin film transistor is arranged in what is called a top-emission type. In the case of a top-emission type, it is preferred to use a material with high reflectance since it is not necessary for light from an OLED to pass through a pixel electrode connected to a pixel circuit. A pixel electrode using a reflecting layer formed from a material having high reflectance such as Ag on a lower layer (layer on the opposite side of the OLED) of a transparent electrode has been disclosed (for example, Japanese Laid Open Patent No. 2015-69861).

Generally, a pixel electrode is formed in an insulation surface. On the other hand, when attempting to increase the reflectance of a reflecting layer, adhesion with an insulation surface sometimes becomes poor due to formation conditions or the material used as the reflecting layer. Although control of the formation conditions of a reflecting layer for example can be considered in order to improve adhesion, this sometimes leads to a decrease in reflectance as a result.

SUMMARY

One aspect of the present invention is providing a display device including a display region arranged with a plurality of pixels in a matrix shape, wherein each of the plurality of pixels includes a first electrode including a first conducting layer on the first conducting layer and comprised from Mo or a Mo alloy, a second conducting layer comprised from Ag or an Ag alloy, and a third conducting layer on the second conducting layer and comprised from a metal oxide having conducting properties, the first electrode being arranged corresponding to each of the pixels respectively, a light emitting layer above the third conducting layer and emitting light according to a current supply, and a second electrode above the light emitting layer and allowing at least a part of the light from the light emitting layer to pass through.

In addition, one aspect of the present invention is providing a method of manufacturing a display device, the display device including a display region arranged with a plurality of pixels in a matrix shape, each of the plurality of pixels includes a first electrode arranged corresponding to each of the pixels respectively, a light emitting layer above the first electrode and emitting light according to a current supply and a second electrode above the light emitting layer and allowing at least a part of the light from the light emitting layer to pass through, the method includes a step of forming a first electrode by steps of forming a first electrode by forming a first conducting layer comprised from Mo or a Mo alloy in a region including an insulation surface, forming a second conducting layer comprised from Ag or an Ag alloy on the first conducting layer, forming a third conducting layer comprised from a metal oxide having conductive properties on the second conducting layer, forming a pattern resist correspond to each of the pixels on the third conducting layer, etching the third conducting layer using the pattern resist as a mask, etching the second conducting layer and first conducting layer using an etching solution including a mixed acid including phosphoric acid, nitric acid and acetic acid using the pattern resist and the third conducting layer as a mask; and removing the pattern resist.

DESCRIPTION OF EMBODIMENTS

Each embodiment of the present invention is explained below while referring to the diagrams. Furthermore, the disclosure is merely an example and appropriate modifications could be conceived while maintaining the scope of the invention which are also included in the scope of the present invention. In addition, in order to better clarify the invention, the width and shape etc of each part in the drawings are sometimes shown schematically compared to the actual forms and should not be interpreted as limiting the present invention. In addition, in the specification and each drawing, the same reference symbols are attached to similar elements which have previously been described and a detailed explanation of these elements may be omitted where appropriate

First Embodiment

[Approximate Structure]

A display device in one embodiment of the present invention is an organic EL (electro-luminescence) display device using an OLED. The organic EL display device in this example uses an OLED which emits white light. The white light emitted from this OLED is passed through a color filter to obtain a color display.

The display device has a structure in which a first substrate and second substrate are bonded together by a bonding material. A drive element such as a thin film transistor for controlling the light emitting state of an OLED is arranged in the first substrate. A color filter and the like is formed in the second substrate.

A top emission type is used in which light from an OLED arranged in the first substrate is emitted to the opposite side of the first substrate, passes through a color filter arranged in the second substrate and is viewed by a user.

An aim of the present invention is to favorably form a pixel electrode and to suppress a decrease in reflectance of the pixel electrode.

In the display device in one embodiment of the present invention, it is possible to easily form a pixel electrode used in a top-emission type as explained herein. At this time, it is possible to improve adhesion with respect to an insulation surface and to suppress a decrease in reflectance of a reflecting layer included in a pixel electrode. In addition, it is also possible to easily form a pixel electrode in this type of structure.

[External Structure of a Display Device 1000]

Figure 1:
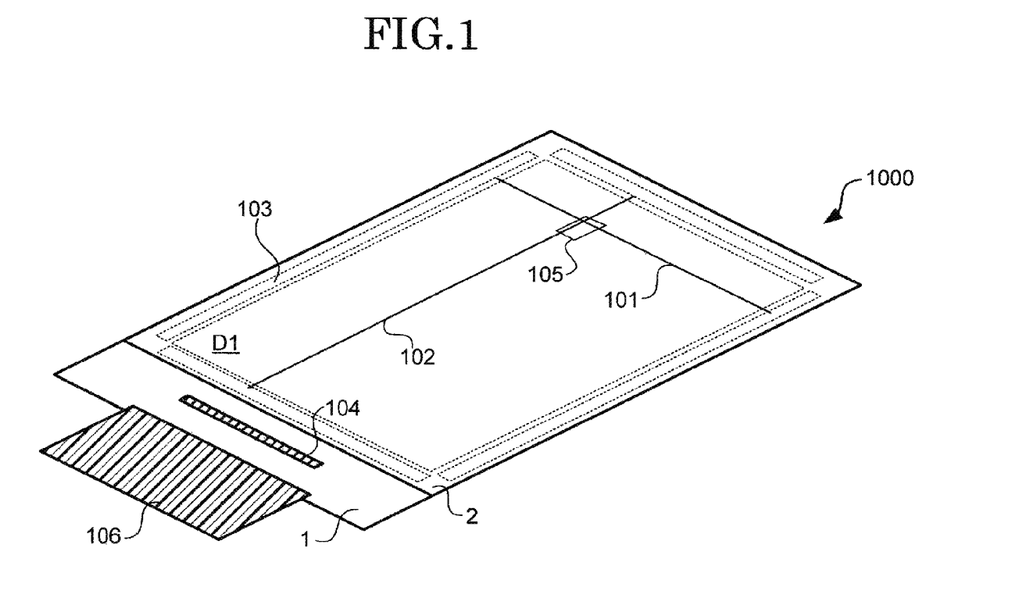
FIG. 1 is a diagram showing an approximate structure of a display device in a first embodiment of the present invention.

FIG. 1 is a diagram showing an approximate structure of a display device in one embodiment of the present invention. The display device 1000 is arranged with a first substrate 1 arranged with a display region D1 and scanning line drive circuit 103, and a second substrate 2 arranged to cover the display region D1 and scanning line drive circuit 103. In addition, the display device 1000 is arranged with a driver IC 104 attached to the first substrate 1 and a FPC (flexible printed circuit) 106. A color filter and the like is arranged in the second substrate 2.

A scanning line 101 and a data signal line 102 which intersects perpendicularly with the scanning line 101 are arranged in the display region D1. A pixel 105 is arranged at a position corresponding to an intersection part between the scanning line 101 and data signal line 102. The pixel 105 is arranged in a matrix shape. Furthermore, although one signal line extends in a direction along the scanning line 101 or data signal line 102 for each pixel 105 in FIG. 1, a plurality of signal lines is also possible. In addition, wiring for supplying a certain voltage such as a power source line may also be arranged in the display region D1.

The scanning line drive circuit 103 supplies a control signal to the scanning line 101. The driver IC 104 supplies a data voltage to the data signal line 102 and controls the scanning line drive circuit 103. Furthermore, other drive circuits may be further arranged in the periphery of the display region D1.

A display element including a pixel circuit for controlling emitted light based on a control signal and data voltage, and a light emitting element (OLED) in which emitted light is controlled by the pixel circuit are arranged in each pixel 105.

A pixel circuit includes a thin film transistor and a condenser for example, drives the thin film transistor using a control signal and data voltage and controls the light emitted by a light emitting element. An image is displayed in the display region D1 by control of this emitted light.

[Cross-Sectional Structure of Display Device 1000]

Next, a cross-sectional structure of the display device 1000 is explained. A cross-sectional structure of a pixel circuit and the like in the display region D1 is explained below.

Figure 2:
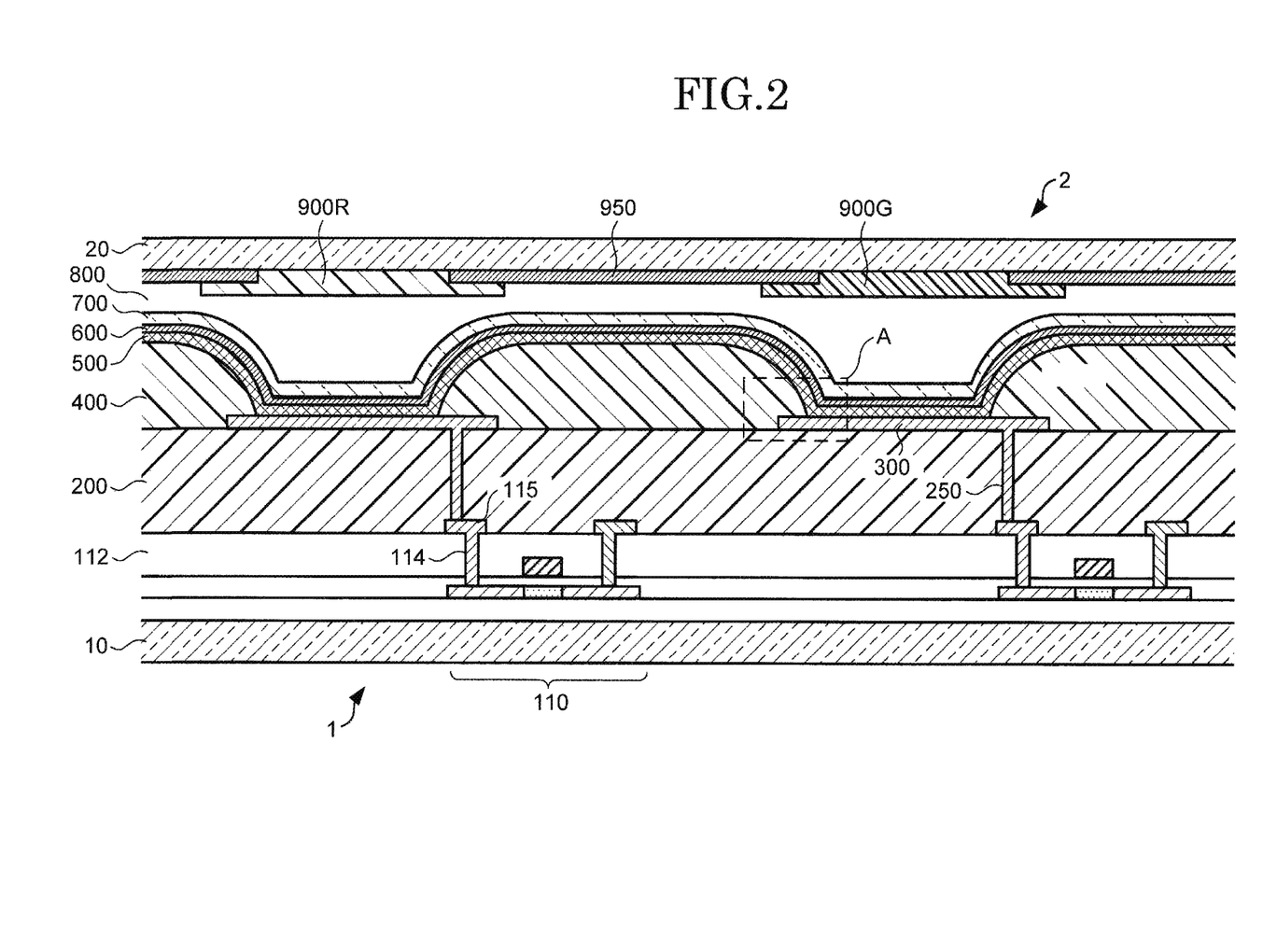
FIG. 2 is a schematic diagram showing a cross-sectional structure in a display region of a display device in a first embodiment of the present invention.

FIG. 2 is a schematic diagram showing a cross-sectional structure in a display region of a display device in the first embodiment of the present invention. In each case the cross-sectional structure explained below is represented as an end view. A first support substrate 10 in the first substrate 1 and a second support substrate 20 in the second substrate 2 are glass substrates. Furthermore, either one or both of the first support substrate 10 and the second support substrate 20 may be resin substrates having flexibility.

The structure of the first substrate 1 is explained. A thin film transistor 110 is arranged above the first support substrate 10. An interlayer insulation layer 200 including an insulation surface is arranged so as to cover the thin film transistor 110. A pixel electrode 300 is arranged above the interlayer insulation layer 200. The interlayer insulation layer 200 is coated with a photosensitive acrylic resin for example, and is formed with a desired pattern by performing exposure, development and sintering. Furthermore, although the interlayer insulation layer 200 is shown as a single layer in FIG. 2, a stacked layer of a plurality of insulation films is also possible. In this case, wiring may be arranged between the plurality of insulation films. In the present example, the interlayer insulation layer 200 has a stacked layer structure including not only an acrylic resin but also a silicon nitride film (SiN) on the other surface side, that is, on the surface side which contacts the pixel electrode 300.

The pixel electrode 300 is arranged corresponding to each pixel 105 and is connected to a conducting layer 115 of the thin film transistor 110 via a contact hole 250 arranged in the interlayer insulation layer 200. The conducting layer 115 is formed from a stacked layer in which aluminum (Al) is sandwiched by titanium (Ti). The pixel electrode 300 is used as an anode electrode of an OLED. Here, because the display device 1000 displays an image using a top-emission method, the pixel electrode may also include translucency. In this example, the pixel electrode 300 includes a layer which reflects light emitted by an OLEO. The pixel electrode 300 has a stacked layer structure including a first conducting layer 310, second conducting layer 320 and third conducting layer 330 from the side of the interlayer insulation layer 200 (see FIG. 6E).

Since the first conducting layer 310 contacts the interlayer insulation layer 200, good adhesion with the interlayer insulation layer 200 and good adhesion with the second conducting layer 320 is required. In this example, the first conducting layer 310 is molybdenum (Mo). Furthermore, the first conducting layer 310 may also be a molybdenum alloy (Mo alloy). In addition, a good connection (realization of an ohmic contact etc.) between the first conducting layer 310 and a conducting layer (conducing layer 115 in this example) which are connected via the contact hole 250 is also required. Although there are various materials that meet these demands, it is possible to easily form the pixel electrode 300 described herein by using Mo or a Mo alloy in the first conducting layer 310.

In addition, the second conducting layer 320 is required to have high reflectance to light in the visible light range. In this example, the second conducting layer 320 is silver (Ag). Furthermore, the second conducting layer 320 may also be a silver alloy (Ag alloy).

The third conducting layer 330 may be a conductive metal oxide and is preferred to have translucency. Since the third conducting layer 330 contacts an OLED, it is required to have a useful work function due to a relationship with an OLED. A conductive metal oxide is preferred as this material. In this example, the third conducting layer 330 is ITO (Indium Tin Oxide). Furthermore, as much as possible a high reflectance is required since light should not be prevented from being reflected. Furthermore, it is also possible to efficiently emit light from an OLED to the exterior due to a good interference effect by controlling film thickness to a certain value.

A bank layer 400 covers an end part of the pixel electrode 300 and gaps between adjacent pixels and is arranged with an aperture part which exposes a part of the pixel electrode 300. In addition, in this example the bank layer 400 is formed by an organic insulation material such as acrylic resin and the like.

A light emitting layer 500 is an OLED which covers the pixel electrode 300 and bank layer 400 and contacts with this structure. A translucent electrode 600 covers the light emitting layer 500 and forms a cathode (opposing electrode with respect to the pixel electrode 300) of the OLED. The translucent electrode 600 is an electrode which allows light from the OLED to pass through and is formed from a metal oxide such as ITO or IZO for example or a thin metal layer sufficient to allow light to pass through. A sealing layer 700 is a layer for suppressing components which degrade a light emitting layer such as water or gas and the like from reaching the light emitting layer 500 and is an inorganic insulation layer such as silicon nitride covering the translucent electrode 600.

Light which displays an image is emitted by passing through the translucent electrode 600 when a current is supplied to the light emitting layer 500 via the pixel electrode 300 and translucent electrode 600. As a result, a region of the pixel electrode 300 exposed by the bank layer 400 and the protective layer 350 serves as a light emitting region. The expanded image of the region A in FIG. 2 corresponds to the image shown in FIG. 6D described below. This completes the explanation of the first substrate 1.

Next, the structure of the second substrate 2 is explained. A light shielding layer 950 and color filters 900R, 900G, 900B and 900W corresponding to red (R), green (G), blue (B) and white (W) are arranged in a second support substrate 20. The color filters 900B and 900W are omitted from FIG. 2. The light shielding layer 950 is formed from a material having light shielding properties such as metal. In addition, the light shielding layer 950 is arranged in a boundary part of different color pixels and a region on the exterior side of the display region D1.

The color filters 900R, 900G, 900B and 900W are arranged corresponding to a light emitting region in each pixel. The color filters 900R, 900G, 900B and 900W are coated with a photosensitive resin including a pigment representing each color and become layers formed with a desired pattern via exposure, development and sintering processes. The color filter 900W may also be formed by a resin which does not include a pigment. A printing method or an inkjet method may be used to form the color filters.

The bonding material 800 is an acrylic resin for example and is filled between the first substrate 1 and second substrate 2 to bond the substrates together. It is necessary to have translucency in the case where the bonding material 800 is arranged in the display region D1.

[Manufacturing Method of Display Device 1000]

Next, a manufacturing method of the display device 1000 described above is explained using FIG. 3 to FIG. 8.

Figure 3:
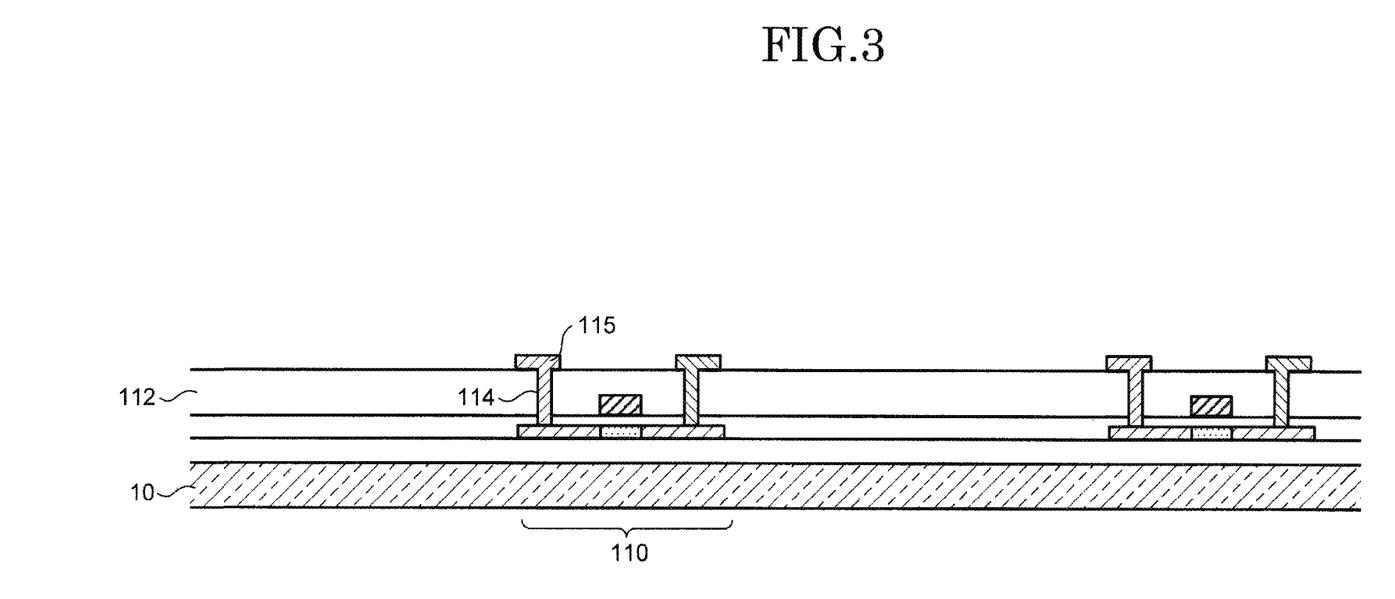
FIG. 3 is a diagram for explaining a process for forming a thin film transistor in a manufacturing method in the first embodiment of the present invention.
Figure 4:
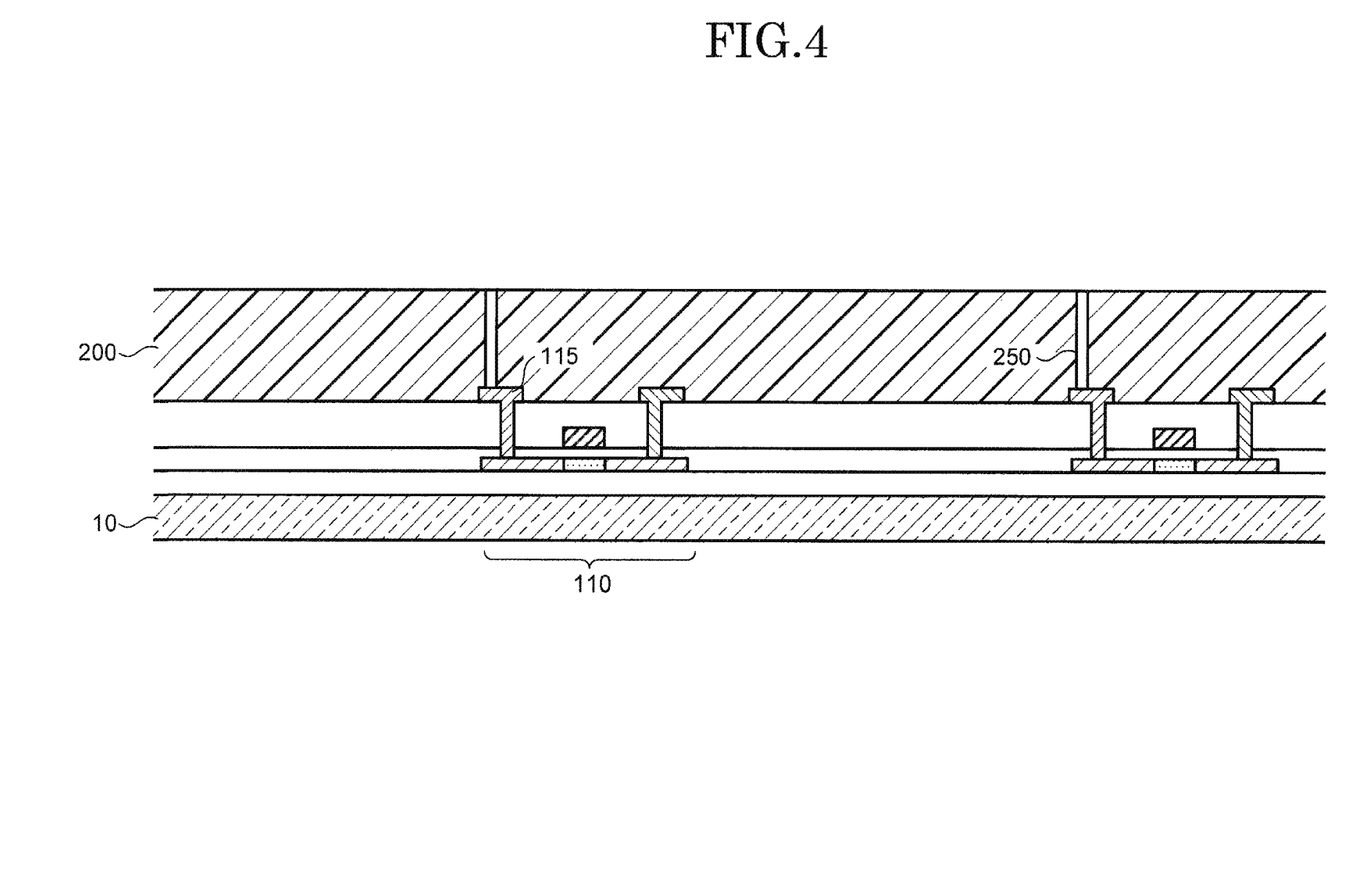
FIG. 4 is a diagram for explaining a process after FIG. 3 in a manufacturing method in the first embodiment of the present invention.
Figure 5:
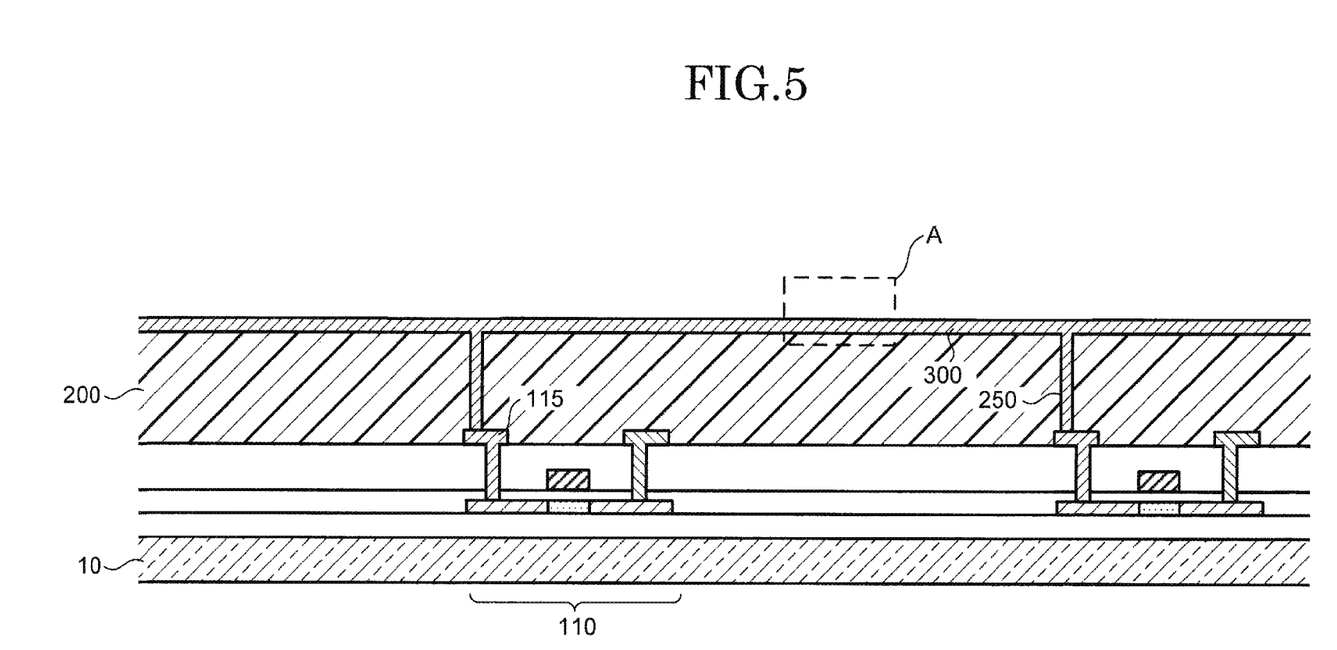
FIG. 5 is a diagram for explaining a process after FIG. 4 in a manufacturing method in the first embodiment of the present invention.

FIG. 3 is a diagram for explaining a process for forming a thin film transistor in the manufacturing method of the display device in the first embodiment of the present invention. FIG. 4 is a diagram for explaining a process after FIG. 3 in the manufacturing method of the display device in the first embodiment of the present invention. FIG. 5 is a diagram for explaining a process after FIG. 4 in the manufacturing method of the display device in the first embodiment of the present invention. First, the thin film transistor 110 is formed in the first support substrate 10 (FIG. 3). Here, the thin film transistor 110 includes a source, drain and gate, is covered by an interlayer insulation layer 112 which is arranged with a contact hole 114 which is connected to the source, drain and gate, and is arranged with a conducting layer 115 connected to the source and drain via the contact hole 114. An insulation layer such as silicon oxide or silicon nitride and the like may be formed between the first support substrate 10 and the thin film transistor 110. Water or gas and the like can be suppressed from entering the interior using this insulation layer.

An interlayer insulation layer 200 arranged with a contact hole 250 is formed so as to cover the thin film transistor 110 (FIG. 4). Next, a stacked conducting layer corresponding to the pixel electrode 300 is formed so as to cover the interlayer insulation layer 200 (FIG. 5). In this example, as is described herein, the first conducting layer 310 is formed on the interlayer insulation layer 200, the second conducing layer 320 is formed on the first conducting layer 310 and the third conducting layer 330 is formed on the second conducting layer 320. Following this, the stacked conducting layer is etched to form a pattern of the pixel electrode 300. This process is explained using the expanded region A (vicinity of the end part of the pixel electrode 300) shown in FIG. 5.

Figure 6A:
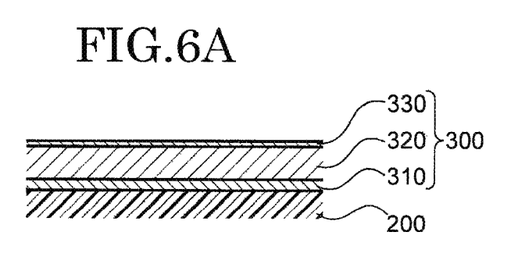
FIG. 6A to FIG. 6E are diagrams for explaining a process after FIG. 5 in a manufacturing method in the first embodiment of the present invention using an expanded view of an end part of a pixel electrode.

FIG. 6A to FIG. 6E are diagrams for explaining a process after FIG. 5 in a manufacturing method in the first embodiment of the present invention using an expanded view of an end part of a pixel electrode. FIG. 6A is an expanded diagram of the region A in FIG. 5. The first conducting layer 310, second conducting layer 320 and third conducting layer 330 are formed in this order on the interlayer insulation layer 200.

In this example, the first conducing layer 310 is a Mo film and has a film thickness of 30 nm (preferably 10 nm or more and 50 nm or less). The second conducing layer 320 is an Ag film and has a film thickness of 150 nm (preferably 100 nm or more and 200 nm or less). The third conducing layer 330 is an ITO film and has a film thickness of 10 nm (preferably 5 nm or more and 15 nm or less). Each of these conducting layers is formed by sputtering.

Figure 6B:
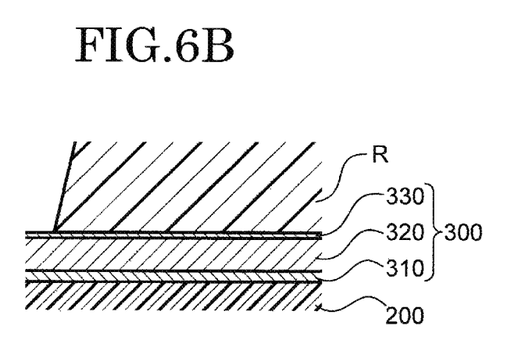
Figure 6C:
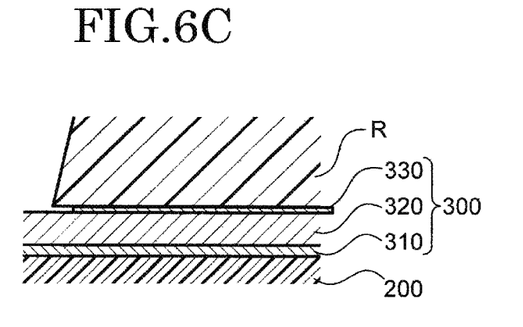

In this state, a resist R is formed in the surface of the third conducting layer 330 (FIG. 6B). The resist pattern corresponds to the pattern of the pixel electrode 300. Next, the third conducting layer 330 is etched using the resist R as a mask (FIG. 6C). In this example, the third conducting layer 330 is etched using wet etching by an ITO etching solution. Oxalic acid for example is used as the ITO etching solution. Furthermore, the second conducting layer 320 is hardly etched by the ITO etching solution.

Figure 6D:
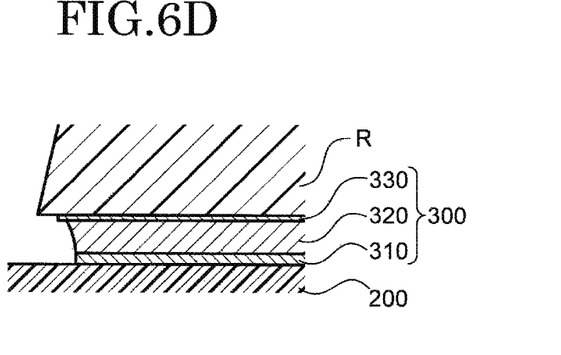

Next, the second conducting layer 320 and first conducting layer 310 are etched using the resist R and third conducting layer 330 as a mask (FIG. 6D). In this example, the second conducting layer 320 and first conducting layer 310 are etched using wet etching by an Ag etching solution. A mixed acid including phosphoric acid, nitric acid and acetic acid, for example, is used as the Ag etching solution. This mixed acid, for example, is adjusted to a range of phosphoric acid 30~70 vol %, nitric acid 0.5~10 vol % and acetic acid 20~50 vol % and further includes water. It is possible to etch not only the second conducting layer 320 (Ag film) but also the first conducting layer (Ma film) using the etching solution including this mixed acid. The etching rate of the first conducting layer 310 with respect to the mixed acid is 0.2 times or more and 5 times or less with respect to the etching rate of the second conducting layer 320, preferably 0.5 times or more and 2 times or less and more preferably 0.8 times or more and 1.25 times or less. Furthermore, the etching rate of the second conducting layer 320 with respect to this mixed acid becomes about a few tens to hundreds of times the etching rate with respect to the third conducting layer 330. As a result, an end part of the second conducting layer 320 becomes located further to the center of the pixel electrode 300 than an end part of the third conducting layer 330.

Furthermore, in the case where the etching rate of the second conducting layer 320 is larger than the etching rate of the first conducting layer 310, the end part of the second conducting layer 320 becomes located further to the center of the pixel electrode 300 than an end part of the first conducting layer 310. Reversely, in the case where the etching rate of the second conducting layer 320 is smaller than the etching rate of the first conducting layer 310, the end part of the first conducting layer 310 becomes located further to the center of the pixel electrode 300 than an end part of the second conducting layer 320.

Figure 6E:
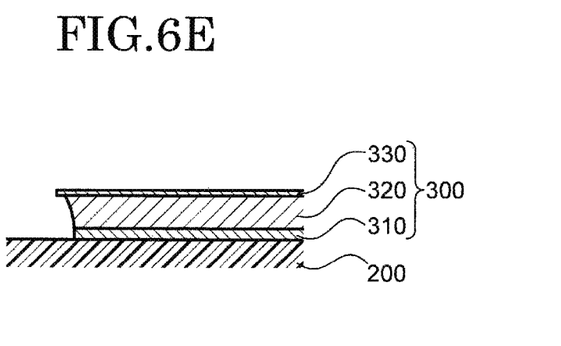

Next, the resist R is removed from the pixel electrode 300 (FIG. 6E). The pixel electrode 300 is formed in this way. The pixel electrode 300 is formed with the second conducting layer 320 as a light reflecting layer. It is necessary to reduce the film formation temperature of Ag in order to increase the reflectance of the second conducting layer 320. In the case where the second conducting layer 320 is formed in contact with the interlayer insulation layer 200, when the film formation temperature of Ag is reduced, adhesion between the second conducting layer 320 and the interlayer insulation layer 200 is reduced.

On the other hand, even if the film formation temperature of Ag decreases due to the presence of the first conducting layer 310 (Mo film) between the second conducting layer 320 and interlayer insulation layer 200, it is possible to control a decrease in adhesion compared to the example where the first conducting layer 310 is not present. In addition, the etching rate with respect to the mixed acid described above is close between the second conducting layer 320 and first conducting layer 310. Therefore, it is possible to perform etching in the same process without changing the etching solution between the second conducting layer 320 and first conducting layer 310.

Here, a case in which a first conducting layer 310Z of an ITO film is used instead of the first conducting layer 310 of a MO film as a comparative example. A simple explanation is provided using FIG. 10A to FIG. 10D. Furthermore, the same as the case of the first conducting layer 310 of a MO film, an example was selected in which the first conducting layer 310 (Mo film) was replaced with the first conducting layer 310Z (ITO film) as a film which can control a decrease in adhesion between the second conducting layer 320 and interlayer insulation layer 200.

Figure 10A:
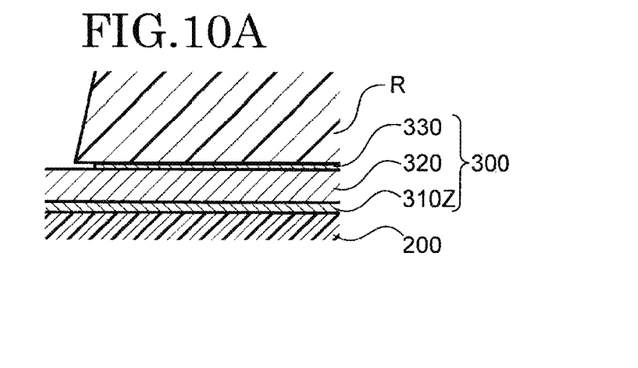
FIG. 10A to FIG. 10D are diagrams for explaining a manufacturing method of a display device of a comparative example.
Figure 10B:
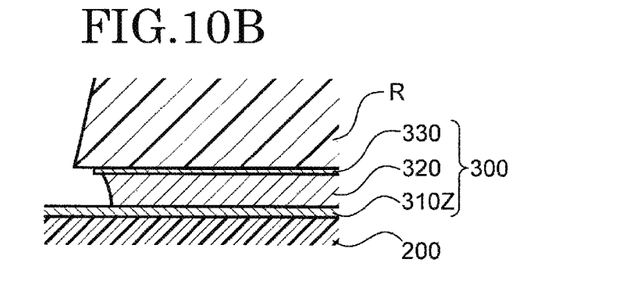

FIG. 10A to FIG. 10D are diagrams for explaining an example of a manufacturing method of the display device of a comparative example. FIG. 10A is a diagram corresponding to FIG. 10C. In the comparative example, in the state shown in FIG. 10A, the second conducting film 320 is etched using the resist R and third conducting layer 330 as a mask (FIG. 10B). In this example, the second conducting layer 320 is etched using wet etching by an Ag etching solution (the mixed acid described above). Although it is possible to etch the second conducting layer 320 (Ag film) using the mixed acid, the first conducting layer 310Z (ITO film) has an etching rate of about 1/a few tens to 1/100 times and is hardly etched. Furthermore, although it is possible to etch the first conducting layer 310Z if more etching time is spent, since etching proceeds significantly in the side surface of the second conducting layer 320, it is difficult to form a desired shape.

Figure 10C:
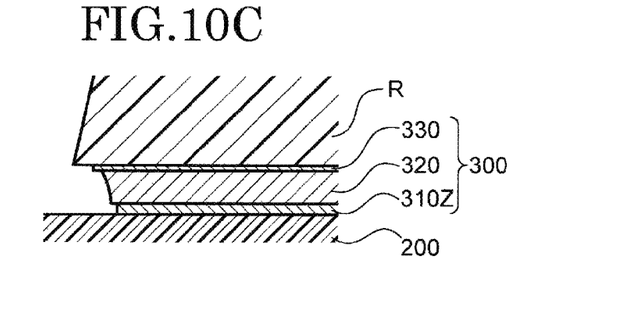
Figure 10D:
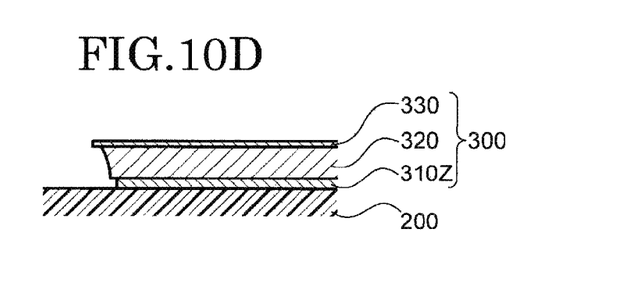

Next, the first conducting layer 310Z is etched using the resist R, third conducting layer 330 and second conducting layer 320 as a mask (FIG. 10C). In this example, the first conducting layer 310Z is etching using wet etching by an ITO etching solution (oxalic acid). Next, the resist R is removed from the pixel electrode 300 (FIG. 10D). The pixel electrode 300 is formed in this way. Even with this structure, it is possible to form the pixel electrode 300 in which a reflecting layer is provided and adhesion with the interlayer insulation layer 200 is secured. On the other hand, it is necessary to switch an etching solution twice in the comparative example. Therefore, the manufacturing method in which a wet etching solution in the first embodiment is switched once can form the pixel electrode 300 more easily.

Figure 7:
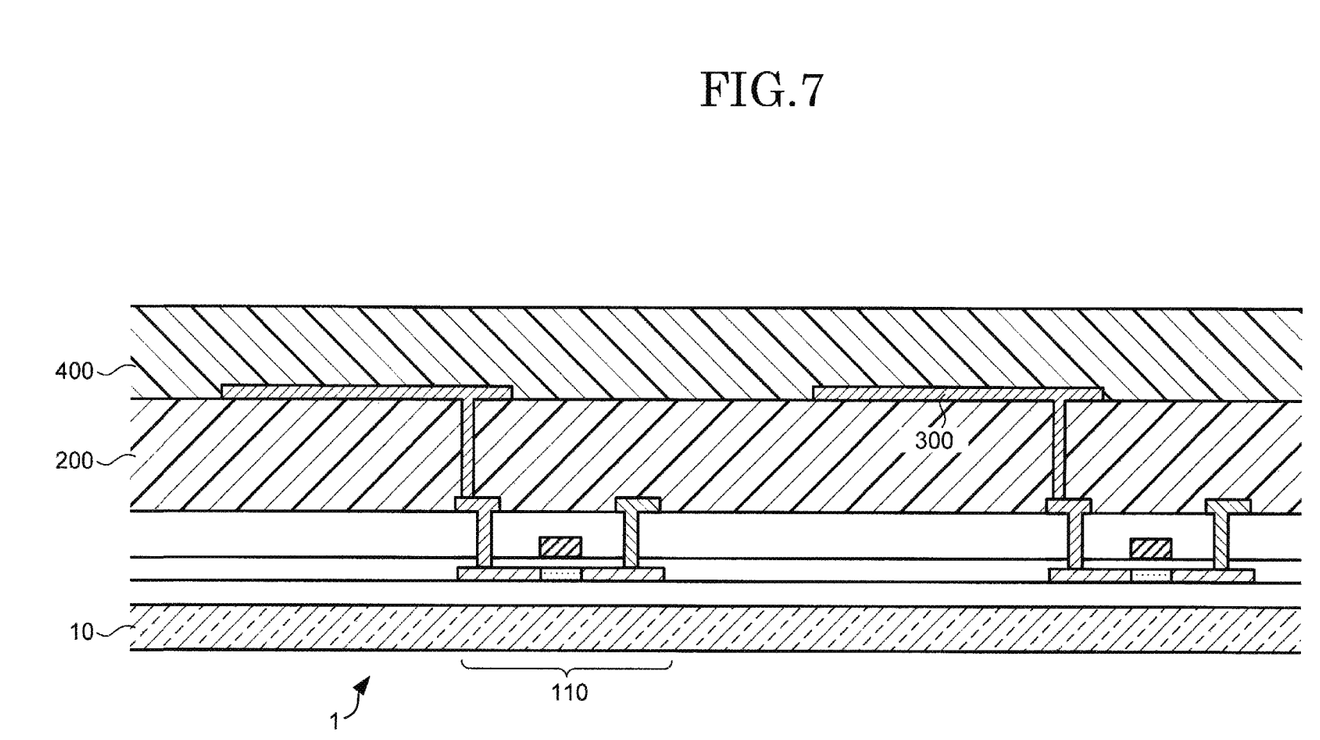
FIG. 7 is a diagram for explaining a process after FIG. 6E in a manufacturing method in the first embodiment of the present invention.
Figure 8:
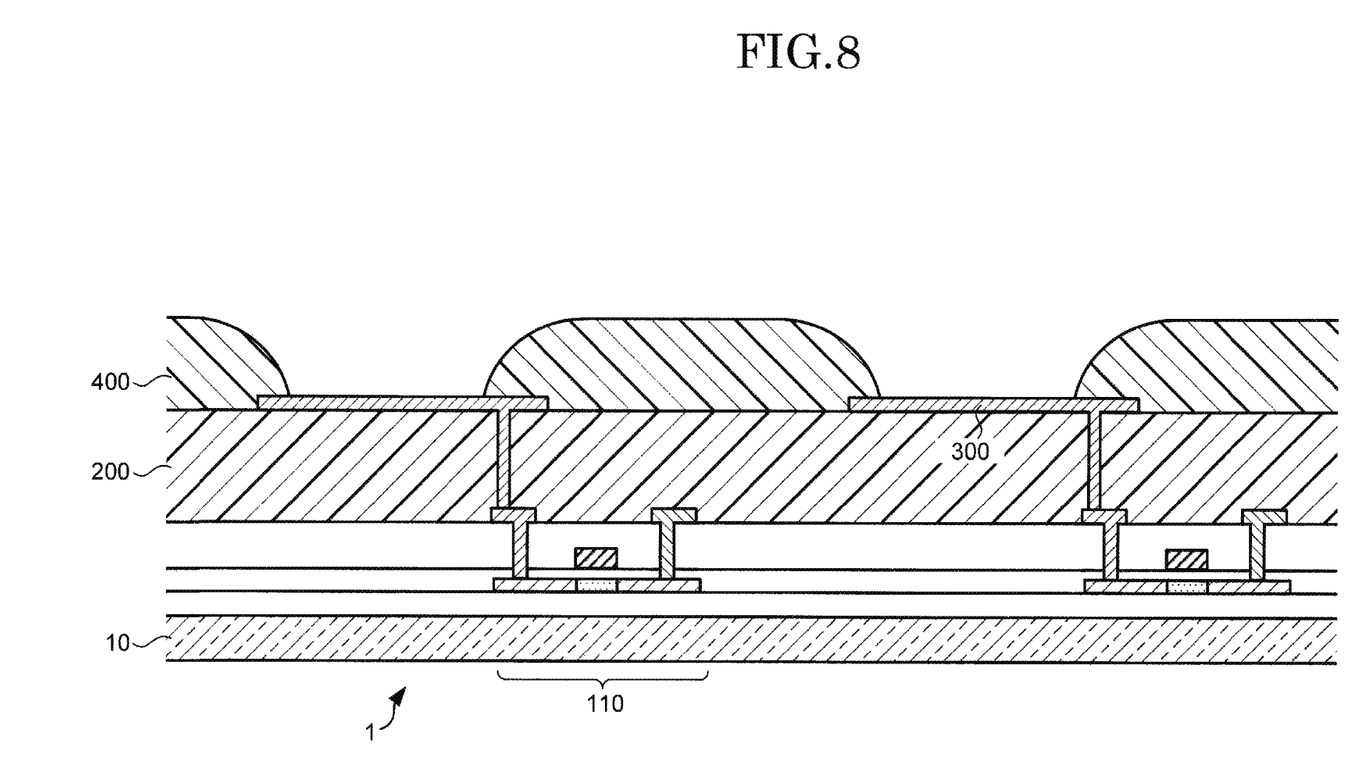
FIG. 8 is a diagram for explaining a process after FIG. 7 in a manufacturing method in the first embodiment of the present invention.

FIG. 7 is a diagram for explaining a process of a manufacturing method of the display device in the first embodiment of the present invention after FIG. 6E. FIG. 8 is a diagram for explaining a process of a manufacturing method of the display device in the first embodiment of the present invention after FIG. 7. FIG. 7 shows a state whereby a material (photosensitive acrylic resin in this example) which becomes the bank layer 400 is coated in the state shown in FIG. 6E. Following this, the bank layer 400 with a desired pattern is formed by exposing, developing and sintering the coated photosensitive acrylic resin. The bank layer 400 is formed so as to expose a part of the surface of the pixel electrode 300 (third conducting layer 330) (FIG. 8).

Following this, when the light emitting layer 500, transparent electrode 600 and sealing layer 700 are formed so as to cover the bank layer 400, the structure of the first substrate 1 shown in FIG. 2 is formed.

Second Embodiment

Although the third conducting layer 330, first conducting layer 310 and second conducting layer 320 in the first embodiment are etched using different etching solutions, an example is explained in the second embodiment in which etching is performed using the same etching solution.

Figure 9A:
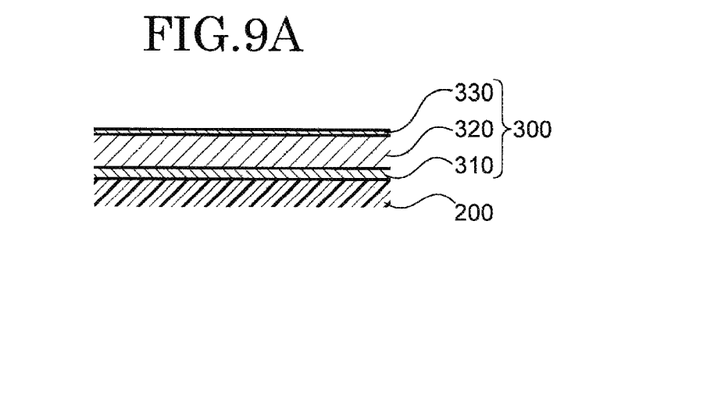
FIG. 9A to FIG. 9E are diagrams for explaining a process corresponding to FIG. 6E in a manufacturing method in the second embodiment of the present invention.
Figure 9B:
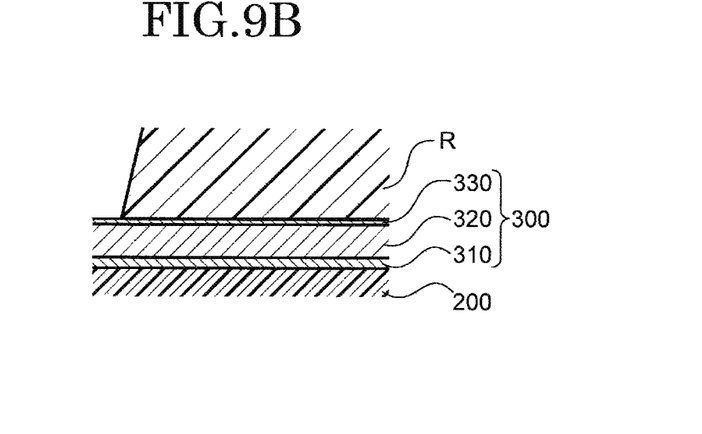

FIG. 9A to FIG. 9E are diagrams for explaining a process corresponding to FIG. 6A to FIG. 6E in the manufacturing method of the display device in the second embodiment of the present invention. The first conducting layer 310, second conducting layer 320 and third conducting layer 330 are stacked (FIG. 9A). A resist R corresponding to the pattern of the pixel electrode 300 is formed on the third conducting layer 330 (FIG. 9B). The process hereto is the same as in the first embodiment.

In the second embodiment, following this, the third conducting layer 330 is etched using a mixed acid including phosphoric acid, nitric acid and acetic acid. It is possible to etch the first conducting layer 310 and second conducting layer 320 using an etching solution including this mixed acid. On the other hand, the etching rate of the third conducting layer 330 is about 1/a few tens to 1/100 times the etching rate with respect to the first conducting layer 310 and second conducting layer 320. However, the third conducting layer 330 is extremely thin compared to the first conducting layer 310 and second conducting layer 320. The film thickness of the third conducting layer 330 is about 1/a few tens to 1/10 times with respect to the total film thickness of the first conducting layer 310 and second conducting layer 320. As a result, the etching time of the third conducting layer 330 takes only a few to 10 times the etching time of the first conducting layer 310 and second conducting layer 320.

Figure 9C:
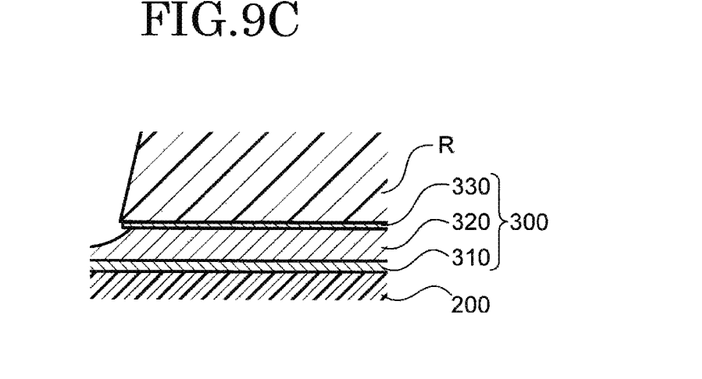
Figure 9D:
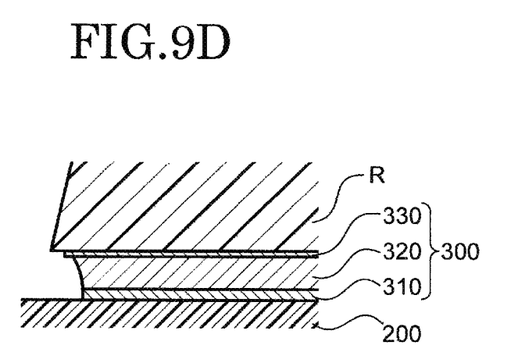
Figure 9E:
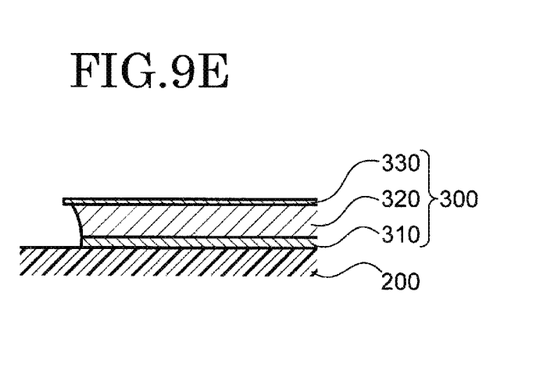

FIG. 9C shows the situation after etching of the third conducting layer 330 is completed. Since an etching solution including the mixed acid described above is used for etching the third conducting layer 330, etching of the second conducting layer 320 starts soon after etching of the third conducting layer 330 is finished. Next, etching continues of the second conducting layer 320 and first conducting layer 310 the same as in the first embodiment (FIG. 9D). The resist R is removed from the pixel 300 (FIG. 9E). The pixel electrode 300 is formed in this way.

When the pixel electrode is formed in the comparative example described above, the wet etching solution is switched twice and in the first embodiment the wet etching solution is switched once. In the second embodiment, although the etching time of the third conducting layer 330 is longer compared to the first embodiment, the pixel electrode 300 can be formed without switching a wet etching solution.

Other Embodiments

The first conducting layer 310 described above may be formed using a Mo alloy in addition to Mo. For example, the Mo alloy may be MoW. At this time, the contained amount of W is preferred to be less than 15 at % and more preferably less than 10 at %. When the contained amount of W is high, the MoW can not be etched just using a mixed aced and it is necessary to perform etching using hydrofluoric acid. Furthermore, if it is a Mo alloy on which etching can be performed using just a mixed acid, a metal other than W may also be contained.

The second conducting layer 320 described above may be formed using an Ag alloy in addition to Ag. For example, the Ag alloy may be AgPaCu. At this time, the contained amount of Ag is preferred to be 90 at % or more and more preferably 95 at %. When the contained amount of Ag is low, thermal resistance improves but reflectance decreases.

In the category of the concept of the present invention, a person ordinarily skilled in the art could conceive of various modifications and correction examples and could understand that these modifications and correction examples belong to the scope of the present invention. For example, with respect to each embodiment described above, a person ordinarily skilled in the art could appropriately perform an addition or removal of structural components or design modification or an addition of processes or an omission or change in conditions which are included in the scope of the present invention as long as they do not depart from the subject matter of the present invention.

What is claimed is:

1. A display device comprising:
a display region arranged with a plurality of pixels in a matrix shape, wherein
each of the plurality of pixels comprises:
a first electrode including a first conducting layer comprised from Mo or a Mo alloy, a second conducting layer on the first conducting layer and comprised from Ag or an Ag alloy, and a third conducting layer on the second conducting layer and comprised from a metal oxide having conducting properties, the first electrode being arranged corresponding to each of the pixels respectively;
a light emitting layer above the third conducting layer and emitting light according to a current supply; and
a second electrode above the light emitting layer and allowing at least a part of the light from the light emitting layer to pass through, and
an end part of the first conducting layer and an end part of the second conducting layer are located closer to a center region of a pixel than an end part of the third conducting layer.

2. The display device according to claim 1, wherein the third conducting layer allows at least a part of the light from the light emitting layer to pass through.

3. The display device according to claim 2, wherein the third conducting layer is ITO.

4. A display device comprising:
a display region arranged with a plurality of pixels in a matrix shape, wherein
each of the plurality of pixels comprises:
a first electrode including a first conducting layer, a second conducting layer on the first conducting layer, and a third conducting layer on the second conducting layer, the first electrode being arranged corresponding to each of the plurality of pixels respectively;
a light emitting layer above the third conducting layer and emitting light according to a current supply; and
a second electrode above the light emitting layer and allowing at least a part of the light from the light emitting layer to pass through, and
an end part of the first conducting layer and an end part of the second conducting layer are located closer to a center region of a pixel than an end part of the third conducting layer.

5. The display device according to claim 4, wherein the first conducting layer comprises Mo or Mo alloy,
the second conducting layer comprises Ag or Ag alloy, and
the third conducting layer comprises metal oxide.

6. The display device according to claim 4, wherein the third conducting layer allows at least a part of the light from the light emitting layer to pass through.

7. The display device according to claim 6, wherein the third conducting layer is ITO.

* * * * *